Nov. 16, 1965 W. G. CROUSE 3,218,474

UNI-DIRECTIONAL TUNNEL DIODE CIRCUITS

Filed May 23, 1962

INVENTOR
WILLIAM G. CROUSE

BY John C Black
ATTORNEY 3,218,474

UNI-DIRECTIONAL TUNNEL DIODE CIRCUITS

William G. Crouse, Endwell, N.Y., assignor to International Business Machines Corporation, New York, N.Y., a corporation of New York Filed May 23, 1962, Ser. No. 197,047
5 Claims. (Cl. 307—88.5)

This invention relates generally to improved tunnel diode circuits and more particularly to improved tunnel diode circuits which assure reliable uni-directional operation.

One of the most serious problems that has been encountered in the development of tunnel diode circuits is that of providing reliable uni-directional characteristics when the tunnel diode circuits are utilized in cascaded circuits, multistage logic circuits, shift registers and the like. Immediately following the discovery of the tunnel diode, it was suggested that the provision of a conventional diode in the input circuit to the tunnel diode would provide uni-directional mode of operation. However, over the following period of experimentation, it was found that this did not insure the necessary uni-directional characteristics. In order to overcome this intolerable characteristic, various arrangements have been proposed such as fairly complex gating and bias control means and more typically the interposition between tunnel diode stages of transistors which assure the desired uni-directional characteristics. It is readily apparent that these approaches result in the loss of the primary advantages of the tunnel diode, i.e., low cost and high speed.

Accordingly, it is a primary object of the present invention to provide an improved tunnel diode circuit which insures uni-directional operating characteristics.

It is another important object of the present invention to provide an improved tunnel diode logic circuit.

It is another object of the present invention to provide an improved tunnel diode monostable device.

It is another object of the present invention to provide an improved shift register employing tunnel diodes in its various stages.

In the preferred form of the invention, the above objects are achieved by the provision in the input circuit of the tunnel diode of a resistor adapted to receive input signals, a capacitor adapted to receive input gating signals slightly delayed in time with respect to the first mentioned input signals and a semiconductor device connected to the resistor and capacitor for applying a switching pulse to the tunnel diode when the input signal conditions are satisfied. This input circuit has been found to reliably assure uni-directional operation of the circuit.

The foregoing and other objects, features and advantages of the invention will be apparent from the following more particular description of preferred embodiments of the invention, as illustrated in the accompanying drawings.

Figure 1:
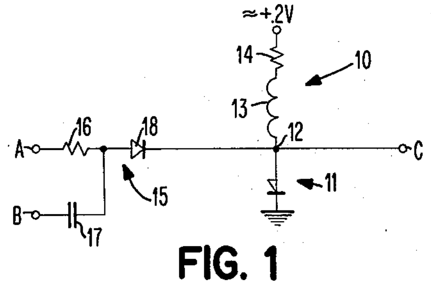
FIG. 1 is a schematic diagram of a monostable device incorporating the teachings of the present invention.

The monostable circuit 10 of FIG. 1 comprises a tunnel diode 11 with its cathode connected to ground potential and its anode connected to junction 12. A series connected inductor 13 and resistor 14 are connected between the junction 12 and a source of bias potential of approximately +.2 volt. An input circuit 15 comprising a resistor 16, a capacitor 17 and a diode 18 is adapted to receive input signals at a pair of terminals A and B. The anode of the diode is connected to the resistor 16 and the capacitor 17 while the cathode is connected to the junction 12 for applying positive switching pulses to the anode of the tunnel diode when the input signal conditions are satisfied. The output of the circuit is taken from terminal C which is directly connected to the junction 12.

Figure 3:
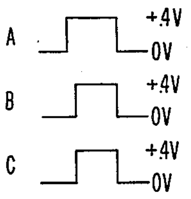
FIG. 3 illustrates the input and resulting output waveforms of the circuit of FIG. 1.
Figure 2:
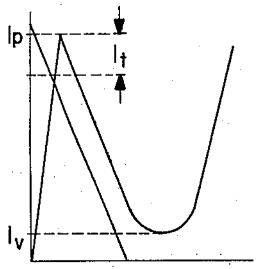
FIG. 2 illustrates the current-voltage characteristics of the tunnel diode and the load line of the circuit of FIG. 1.

FIG. 2 illustrates the load line characteristic of the inductor 13 and the resistor 14, and it can be seen that only one stable state of operation can be maintained. It will be appreciated that in some applications the resistor 14 may be the internal resistances of the inductor 13 and the tunnel diode 11. The input signals (FIG. 3) supplied to the terminals A and B are characterized by a rise from a ground or zero volt potential to a positive .4-volt level, and the output signal rises from a zero volt level to a positive .4-volt level. It will be noted that the leading edge of the signal applied to the input terminal B is slightly delayed in time with respect to the leading edge of the input signal to the terminal A. This permits a positive .4-volt charge to be applied to the capacitor 17 prior to the initiation of the positive-going input pulse at terminal B.

The diode 18 is selected with a characteristic such that it will not conduct heavily until it is forward biased to a voltage greater than the high voltage level (positive .4 volt) of the tunnel diode. Both silicon and selenium diodes have this property. Thus the application of a positive .4-volt potential to the input terminal A will not cause heavy conduction by the diode 18 nor will it cause switching action in the tunnel diode 11.

However, when the positive .4-volt signal is applied to the input terminal B with a positive .4-volt charge across the capacitor 17, the anode of the diode 18 will be driven from positive .4 volt toward positive .8 volt thus causing the diode to conduct heavy and provide the required $I_t$ to the tunnel diode, thus firing the single shot circuit. When the current $I_t$ applied to the tunnel diode is of sufficient magnitude to exceed the peak current, the high A.C. impedance of the inductor 13 will allow the tunnel diode to switch to its high voltage state. It will remain there until the current in the inductor decays to a value less than the valley current $I_v$ at which time the tunnel diode will switch back to the low voltage state and remain there until it is triggered again.

The input circuit comprising the resistor 16, the capacitor 17 and the diode 18 will prevent the output pulse from trriggering any preceding circuit in which a tunnel diode such as 11 is connected directly to either input terminal A or B.

Figure 4:
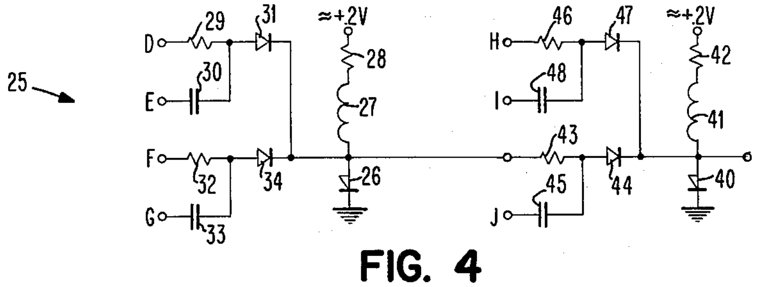
FIG. 4 is a schematic diagram of a logic circuit utilizing the teachings of the present invention.

FIG. 4 illustrates by way of example a two-stage or double level logic circuit 25 incorporating the teachings of the present invention. Each stage of the logic circuit 25 is similar to the circuit of FIG. 1 except that it includes four inputs rather than two.

Thus the logic circuit comprises a first tunnel diode 26 connected in series with an inductor 27 and a resistor 28 between the terminals of a source of bias potential. A first pair of input terminals D and E are connected to the anode of the tunnel diode 26 by way of a resistor 29, a capacitor 30 and a diode 31. A second pair of input terminals F and G are connected to the anode of the tunnel diode 26 by way of a resistor 32, a capacitor 33 and a diode 34.

With proper timing of the input signals to the terminals D, E, F and G, a pair of positive AND logic functions, ORed together, are obtained. This can be expressed in Boolean form as $DE+FG$. It will be remembered from the description of FIG. 1 that the input signal to the capacitors 30 and 33 must be slightly delayed in time with respect to the inputs to the resistors 29 and 32 to achieve switching of the tunnel diode. Thus input signals at D and E or at F and G will switch the tunnel diode 26.

The second stage of the logic circuit 25 comprises a tunnel diode 40 connected in series with an inductor 41 and a resistor 42 between the terminals of a source of bias potential. The output of the tunnel diode 26 of the first stage is applied to the resistor 43 input to the second level of the logic circuit. The resistor 43 is connected to the anode of tunnel diode 40 by way of a diode 44. An input terminal J is connected to the diode 44 by way of a capacitor 45. Thus the output logic function of the first stage of the logic circuit 25 is ANDED with the input J of the second stage. The second stage also includes a second pair of input terminals H and I connected to the anode of the tunnel diode 40 by way of a resistor 46 and a diode 47 and a capacitor 48 and the diode 47. Thus, the resistor 46, the capacitor 48 and the diode 47 perform an AND function. The logic function performed by the circuit 25 may be expressed in Boolean form as follows: $(DE+FG)J+HI$.

It will be noted that, in the logic circuit 25 described above, the timing of the capacitor inputs must be such that the leading edge of an input signal to the terminal J must be delayed in time relative to the signal applied to the capacitor input terminals E and G so that the output signal from the tunnel diode 26 is applied to the resistor 43 prior to the leading edge of the input signal to the terminal J. If in a particular application it is desirable to synchronize the leading edges of the input signals to the terminals E, G and J, the output of the tunnel diode 26 is merely connected to the diode 44 by way of the capacitor 45; and the input terminal J connected to the diode 44 by way of the resistor 43. In this manner, the delay time in the first stage may be utilized to provide the delay between the capacitor 45 and resistor 43 input signals. It can be seen therefore that the improved circuit of the present invention lends itself readily to high speed, low cost and very flexible logic applications.

Figure 5:
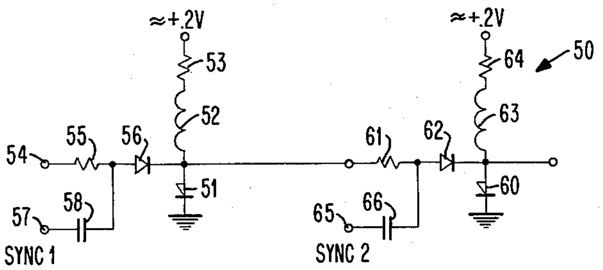
FIG. 5 is a schematic diagram of one stage of a shift register utilizing the teachings of the present invention.

FIG. 5 illustrates the use of the improved circuit of the present application to a shift register. Thus one stage of the shift register requires two circuits substantially similar to that shown in FIG. 1. Two circuits are required rather than one to provide the necessary interstage delays inasmuch as the monostable device must be reset prior to the application of the next switching signals to its inputs.

Thus a single shift register stage 50 comprises a first tunnel diode 51 connected in series with an inductor 52 and a resistor 53 between a source of positive biasing potential. A data signal input terminal 54 is connected to the anode of the tunnel diode 51 by way of a resistor 55 and a diode 56. A source of synchronous pulses (not shown) are connected to an input terminal 57 which is in turn connected to the anode of the tunnel diode 51 by way of a capacitor 58 and the diode 56. In the preferred form, the output of the monostable device described immediately above is applied to the anode of a second tunnel diode 60 by way of a resistor 61 and a diode 62.

The tunnel diode 60 is connected in series with an inductor 63 and a resistor 64 between the terminals of a source of positive biasing potential. A second source of synchronous pulses (not shown) is connected to an input terminal 65 which is in turn connected to the anode of the tunnel diode 60 by way of a capacitor 66 and the diode 62.

Each of the monostable devices of the shift register 50 operates in substantially the same manner as that described above with respect to FIG. 1. It will be noted however, that the leading edge of each synchronous pulse applied to the input terminal 65 is slightly delayed in time with respect to the leading edge of the corresponding synchronous pulse applied to the input terminal 57 so that the high level output pulse of the tunnel diode 51 is applied to the resistor 61 to charge the capacitor 66 prior to the leading edge of the synchronous pulse applied to the input terminal 65. With this dual synchronous pulse arrangement, the resetting of the tunnel diode 51 is assured prior to the shifting of data from the preceding shift register stage in response to the next SYNC 1 pulse.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A unidirectional switching device comprising
first and second tunnel diodes, each having high and low voltage operating states;
means for operating the diodes in one of said states;
means for operating the first tunnel diode in the other state to produce output signals; and
means coupling the first diode to the second diode and preventing output signals from the second diode from affecting the state of the first diode including
a semiconductor element connected to the second diode and characterized by heavy conduction at a minimum forward bias potential greater than the high voltage operating states of the diodes,
said output signals of the first diode providing a first source of input signals to the second diode,
a second source of input signals for the second diode having an amplitude less than said minimum forward bias potential, the leading edges of the signals of one of said sources of input signals being delayed in time with respect to the leading edges of the signals of the other source of input signals, the sum of the amplitudes of said input signals being at least as great as said minimum forward bias potential, and
a resistor connected between said other source of input signals and the semiconductor element and a capacitor connected between said one source of input signals and the semiconductor element for switching the second diode to the other state in response to an input signal from said other source followed by an input signal from said one source.

2. A unidirectional switching device comprising
first and second tunnel diodes, each having high and low voltage operating states;
means for operating at least the second diode in a monostable mode with one of said operating states being stable;
means selectively operating the first tunnel diode in the high and low voltage states to produce output signals; and
means coupling the first diode to the second diode and preventing output signals from the second diode from affecting the state of the first diode including
a semiconductor element connected to the second diode and characterized by heavy conduction at a minimum forward bias potential greater than the high voltage operating states of the diodes,
said output signals of the first diode providing a first source of input signals to the second diode,
a second source of input signals for the second diode having an amplitude less than said minimum forward bias potential, the leading edges of the signals of one of said sources of input signals being delayed in time with respect to the leading edges of the signals of the other source of input signals, the sum of the amplitudes of said input signals being at least as great as said minimum forward bias potential, and
a resistor connected between said other source of input signals and the semiconductor element and a capacitor connected between said one source of input signals and the semiconductor element for switching the second diode to the other state in response to an input signal from said other source followed by an input signal from said one source.

3. A unidirectional switching device comprising first and second tunnel diodes, each having high and low voltage operating states;

means including a series connected inductor for operating each diode in a monostable mode with one of said operating states being stable;

means for switching the first tunnel diode to the other state to produce output signals; and means coupling the first diode to the second diode and preventing output signals from the second diode from affecting the state of the first diode including a semiconductor element connected to the second diode and characterized by heavy conduction at a minimum forward bias potential greater than the high voltage operating states of the diodes, said output signals of the first diode providing a first source of input signals to the second diode, a second source of input signals for the second diode having an amplitude less than said minimum forward bias potential, the leading edges of the signals of one of said sources of input signals being delayed in time with respect to the leading edges of the signals of the other source of input signals, the sum of the amplitudes of said input signals being at least as great as said minimum forward bias potential, a resistor connected between said other source of input signals and the semiconductor element and a capacitor connected between said one source of input signals and the semiconductor element for switching the second diode to the other state in response to an input signal from said other source followed by an input signal from said one source.

4. A unidirectional switching device comprising first and second tunnel diodes, each having high and low voltage operating states;

means including a series connected inductor for operating at least the second diode in a monostable mode with one of said operating states being stable;

means selectively operating the first tunnel diode in the high and low voltage states to produce output signals; and means coupling the first diode to the second diode and preventing output signals from the second diode from affecting the state of the first diode including a semiconductor element connected to the second diode and characterized by heavy conduction at a minimum forward bias potential greater than the high voltage operating states of the diodes, said output signals of the first diode providing a first source of input signals to the second diode, a second source of input signals for the second diode having an amplitude less than said minimum forward bias potential, the leading edges of the signals of one of said sources of input signals being delayed in time with respect to the leading edges of the signals of the other source of input signals, the sum of the amplitudes of said input signals being at least as great as said minimum forward bias potential, and a resistor connected between said other source of input signals and the semiconductor element and a capacitor connected between said one source of input signals and the semiconductor element for switching the second diode to the other state in response to an input signal from said other source followed by an input signal from said one source.

5. An electrical circuit comprising first and second tunnel diodes, each having high and low voltage operating levels;

means biasing each diode for operation in a monostable mode; and means for operating the diodes as a shift register stage and for preventing output signals from the second diode from affecting the first diode including first and second semiconductor elements connected respectively to the first and second diodes and each characterized by heavy conduction at a minimum forward bias potential greater than the high voltage operating levels of the diodes, a source of input signals having an amplitude less than said minimum forward bias potential, a first source of synchronous signals having an amplitude less than said minimum forward bias potential and the leading edges of which are delayed in time with respect to the leading edges of the input signals, the sum of the amplitudes of the input and synchronous signals being at least as great as said minimum forward bias potential of the first semiconductor element, a first resistor connected between the source of input signals and the first semiconductor element and a first capacitor connected between the first source of synchronous signals and the first semiconductor element for switching the first diode to an unstable state in response to an input signal followed by a synchronous signal, a second resistor connected between the first diode and the second semiconductor element for receiving an output signal from the first diode when it is in its unstable state, a second source of synchronous signals having an amplitude less than said minimum forward bias potential and the leading edges of which are delayed in time with respect to the leading edges of the output signals from the first diode, the sum of the amplitudes of the latter synchronous signals and said output signals being at least as great as said minimum forward bias potential of the second semiconductor element, and a second capacitor connected between the second source of synchronous signals and the second semiconductor for switching the second diode to an unstable state in response to an output signal from the first diode followed by a signal from said second source of synchronous signals.

References Cited by the Examiner

UNITED STATES PATENTS

| | | | |
|---|---|---|---|
| 2,975,377 | 3/1961 | Price | 307—88.5 |
| 3,062,971 | 11/1962 | Wallace | 307—88.5 |
| 3,108,229 | 10/1963 | Herzog | 307—88.5 |
| 3,111,592 | 11/1963 | Watters | 307—88.5 |
| 3,141,097 | 7/1964 | Grubb | 307—88.5 |

OTHER REFERENCES

Digital Computer Components and Circuits, by R. K. Richards, D. Van Nostrand Co., Inc., November 1957; pages 55 and 56 relied on.

JOHN W. HUCKERT, *Primary Examiner.*

DAVID J. GALVIN, *Examiner.*